US008703531B2

(12) United States Patent
Honda et al.

(10) Patent No.: US 8,703,531 B2
(45) Date of Patent: Apr. 22, 2014

(54) MANUFACTURING METHOD OF OXIDE SEMICONDUCTOR FILM AND MANUFACTURING METHOD OF TRANSISTOR (75) Inventors: Tatsuya Honda, Isehara (JP); Takatsugu Omata, Isehara (JP); Yusuke Nonaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 237 days.

(21) Appl. No.: 13/034,725

(22) Filed: Feb. 25, 2011

(65) Prior Publication Data

US 2011/0217815 A1 Sep. 8, 2011

(30) Foreign Application Priority Data

Mar. 5, 2010 (JP) ................. 2010-048604

(51) Int. Cl.
*H01L 21/84* (2006.01)
(52) U.S. Cl.
USPC ............. 438/104; 438/158; 257/E21.561
(58) Field of Classification Search
USPC ............. 438/151–166, 104; 257/E21.561
See application file for complete search history.

(56) References Cited

U.S. PATENT DOCUMENTS

| | | |
|---|---|---|
| 5,225,398 A | 7/1993 | Nakanishi et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,157,307 B2 | 1/2007 | Ishizaki |
| 7,189,992 B2 | 3/2007 | Wager, III et al. |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Richard Booth
(74) *Attorney, Agent, or Firm* — Eric J. Robinson; Robinson Intellectual Property Law Office, P.C.

(57) ABSTRACT

An object is to provide a manufacturing method of an oxide semiconductor film with high crystallinity. Another object is to provide a manufacturing method of a transistor with high field effect mobility. In a manufacturing method of an oxide semiconductor film, an oxide semiconductor film is formed over a substrate in an atmosphere in which oxygen is purposely not contained, and then the oxide semiconductor film is crystallized by a heat treatment in an atmosphere containing oxygen.

23 Claims, 4 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,429,823 B2 | 9/2008 | Yamamoto et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,847,287 B2 | 12/2010 | Kim et al. |
| 7,888,207 B2 | 2/2011 | Wager, III et al. |
| 7,910,490 B2 | 3/2011 | Akimoto et al. |
| 7,935,964 B2 | 5/2011 | Kim et al. |
| 7,994,500 B2 | 8/2011 | Kim et al. |
| 8,038,857 B2 | 10/2011 | Inoue et al. |
| 8,058,645 B2 | 11/2011 | Jeong et al. |
| 8,093,589 B2 | 1/2012 | Sugihara et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,222,092 B2 | 7/2012 | Yamazaki et al. |
| 8,236,627 B2 | 8/2012 | Tsubuku et al. |
| 8,247,813 B2 | 8/2012 | Koyama et al. |
| 8,274,078 B2 | 9/2012 | Itagaki et al. |
| 8,367,489 B2 | 2/2013 | Yamazaki |
| 2001/0046027 A1 | 11/2001 | Tai et al. |
| 2002/0042170 A1 | 4/2002 | Yamazaki et al. |
| 2002/0056838 A1 | 5/2002 | Ogawa |
| 2002/0132454 A1 | 9/2002 | Ohtsu et al. |
| 2002/0164888 A1 | 11/2002 | Roh et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017261 A1 | 1/2005 | Ishizaki |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008638 A1 | 1/2009 | Kang et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0224238 A1 | 9/2009 | Kim et al. |
| 2009/0242992 A1 | 10/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0136743 A1 | 6/2010 | Akimoto et al. |
| 2010/0176383 A1 | 7/2010 | Park et al. |
| 2010/0244022 A1 | 9/2010 | Takahashi et al. |
| 2010/0276689 A1 | 11/2010 | Iwasaki |
| 2010/0279462 A1 | 11/2010 | Iwasaki |
| 2010/0283055 A1 | 11/2010 | Inoue et al. |
| 2010/0283509 A1 | 11/2010 | Kim et al. |
| 2010/0320458 A1 | 12/2010 | Umeda et al. |
| 2010/0320459 A1 | 12/2010 | Umeda et al. |
| 2011/0049509 A1 | 3/2011 | Takahashi et al. |
| 2011/0062436 A1 | 3/2011 | Yamazaki et al. |
| 2011/0068852 A1 | 3/2011 | Yamazaki et al. |
| 2011/0073856 A1 | 3/2011 | Sato et al. |
| 2011/0101356 A1 | 5/2011 | Yamazaki |
| 2011/0115839 A1 | 5/2011 | Takahashi et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0175090 A1 | 7/2011 | Sugihara et al. |
| 2011/0193083 A1 | 8/2011 | Kim et al. |
| 2011/0215328 A1 | 9/2011 | Morosawa et al. |
| 2011/0260157 A1* | 10/2011 | Yano et al. .......... 257/43 |
| 2011/0284848 A1 | 11/2011 | Yamazaki |

(56) References Cited

U.S. PATENT DOCUMENTS

| | | |
|---|---|---|
| 2012/0032163 A1 | 2/2012 | Yamazaki |
| 2012/0052624 A1 | 3/2012 | Yamazaki |
| 2012/0064665 A1 | 3/2012 | Yamazaki |
| 2012/0119205 A1 | 5/2012 | Taniguchi et al. |
| 2012/0132908 A1 | 5/2012 | Sugihara et al. |
| 2012/0205651 A1 | 8/2012 | Lee et al. |
| 2013/0082256 A1 | 4/2013 | Yamazaki |
| 2013/0099234 A1 | 4/2013 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-311342 | 12/2008 |
| JP | 2009-295997 | 12/2009 |
| WO | WO-2004/114391 | 12/2004 |
| WO | WO-2008/136505 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15TH International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage controlled Amorphous GIZO ($Ga_2O_3$-$In_2O_3$-ZnO) TFT,", SID Digest International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID Internation Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FDP '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for Amoled Backplane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size Amoled,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn]at Temperatures over 1000° C.,", Journal of Solid State Chemistry, 1985, vol. 60, pp. 382-384.

Kitzerow.H et al., "Observation of Blue Phases in CHIRAL Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No.PCT/JP2011/052970) Dated Mar. 8, 2011.

Written Opinion (Application No.PCT/JP2011/052970) Dated Mar. 8, 2011.

* cited by examiner

MANUFACTURING METHOD OF OXIDE SEMICONDUCTOR FILM AND MANUFACTURING METHOD OF TRANSISTOR

TECHNICAL FIELD

The present invention relates to a crystallization method of an oxide semiconductor film and a transistor using the oxide semiconductor film.

BACKGROUND ART

In recent years, research and development of display devices typified by flat panel displays have been actively pursued, and transistor used in many of them are formed over a glass substrate and use silicon semiconductors such as amorphous silicon and polycrystalline silicon.

In view of this, attention has been drawn to a technique by which a transistor is manufactured using an oxide semiconductor instead of using a silicon semiconductor, and applying this transistor to electronic devices and optical devices. For example, Patent Document 1 and Patent Document 2 disclose techniques by which a transistor is manufactured using zinc oxide which is a single-component metal oxide or an In—Ga—Zn—O-based oxide which is a homologous compound as an oxide semiconductor, and is used as a switching element or the like of a pixel of a display device.

Also, many of the transistors using an oxide semiconductor use an amorphous oxide semiconductor for a channel region. With a transistor using an amorphous oxide semiconductor, higher field effect mobility can be obtained compared to a transistor using amorphous silicon. However, for application to a high performance device, an oxide semiconductor with high crystallinity with which even higher field effect mobility can be obtained is desired, and research and development of various crystallization techniques is underway (see Patent Document 3 and Patent Document 4).

REFERENCE

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2008-311342
[Patent Document 4] Japanese Published Patent Application No. 2009-295997

DISCLOSURE OF INVENTION

To crystallize an oxide semiconductor film, it is necessary to perform a heat treatment at a high temperature of 600° C. or higher, or a laser irradiation treatment. However, since an oxide semiconductor is a material with large binding energy of atoms, a melting point is high as in 2000° C. or higher, and it has been difficult to form an oxide semiconductor film with high crystallinity.

In view of this, in one embodiment of the present invention, an object is to provide a manufacturing method of an oxide semiconductor film with high crystallinity. Furthermore, another object is to provide a manufacturing method of a transistor with a high field effect mobility that uses the oxide semiconductor film.

In one embodiment of the present invention, when manufacturing an oxide semiconductor film, an oxide semiconductor film is formed in an atmosphere in which oxygen is purposely not contained, and then the oxide semiconductor film is subjected to a heat treatment in a gas atmosphere containing oxygen to crystallize the oxide semiconductor film.

The oxide semiconductor film of the one embodiment of the present invention is not limited to an oxide semiconductor film of a single layer, and can be applied to an oxide semiconductor film in which oxide semiconductors with different constituent elements, or oxide semiconductor with the same constituent elements but with different composition ratios are laminated.

In another embodiment of the present invention, a first oxide semiconductor film is formed over a substrate, the first oxide semiconductor film is crystallized by a first heat treatment, a second oxide semiconductor is formed over the crystallized first oxide semiconductor film in an atmosphere in which oxygen is purposely not contained, and then a second heat treatment is performed in an atmosphere containing oxygen to crystallize the second oxide semiconductor film.

In another embodiment of the present invention, a first oxide semiconductor film is formed over a substrate in an atmosphere in which oxygen is purposely not contained, the first oxide semiconductor film is crystallized by a first heat treatment, a second oxide semiconductor film is formed over the crystallized first oxide semiconductor film in an atmosphere in which oxygen is purposely not contained, and then a second heat treatment is performed in a gas atmosphere containing oxygen to crystallize the second oxide semiconductor film.

Also, after forming the first oxide semiconductor film and the second oxide semiconductor film, a heat treatment in which heating is done at a first temperature and a second temperature is performed, so that the first oxide semiconductor film is crystallized at the first temperature and the second oxide semiconductor film is crystallized at the second temperature.

Furthermore, for both the first oxide semiconductor film and the second oxide semiconductor film, as an oxide semiconductor film, the following can be applied: a single-component oxide semiconductor typified by an In—O-based oxide semiconductor, a Sn—O-based oxide semiconductor, or a Zn—O-based oxide semiconductor; or a multi-component oxide semiconductor typified by an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, or an Al—Zn—O-based oxide semiconductor.

Note that in this specification, "atmosphere in which oxygen is purposely not contained" means "atmosphere which an oxide semiconductor film formed therein is oxygen deficient."

In the above, crystallization of the second oxide semiconductor film occurs by the crystallized first oxide semiconductor film acting as a seed crystal.

Also, for both the first oxide semiconductor film and the second oxide semiconductor film, in the case of forming an oxide semiconductor film in the atmosphere in which oxygen is purposely not contained, the oxide semiconductor film is formed in an atmosphere of nitrogen gas, helium gas, neon gas, argon gas, xenon gas, or krypton gas.

Note that, for both the first oxide semiconductor film and the second oxide semiconductor film, the oxide semiconductor film formed in the atmosphere in which oxygen is purposely not contained is crystallized with a c-axis orientation with respect to a substrate surface by performing a heat treatment in a gas atmosphere containing oxygen.

Note that for both the first oxide semiconductor film and the second oxide semiconductor film, by crystallizing the oxide semiconductor film formed in the atmosphere in which oxygen is purposely not contained, by performing a heat treatment in a gas atmosphere containing oxygen, carrier density of the crystallized oxide semiconductor film becomes less than $1 \times 10^{14}/cm^3$.

Also, by using a manufacturing method of the oxide semiconductor film which is one embodiment of the present invention to form a channel region, a transistor with high field effect mobility can be manufactured.

An oxide semiconductor film with high crystallinity can be manufactured. Also, a transistor with high field effect mobility can be manufactured.

BEST MODE FOR CARRYING OUT THE INVENTION

Note that, functions of "source" and "drain" may become switched in the case that a direction of a current flow is changed during circuit operation, for example. Therefore, the terms "source" and "drain" can be used to refer to the drain and the source, respectively, in this specification.
(Embodiment 1)

In this embodiment, a manufacturing method of an oxide semiconductor film with high crystallinity will be described. Also, a crystallization method described in this embodiment can be applied to all multi-component oxide semiconductors, in addition to single-component oxide semiconductors.

A substrate over which an oxide semiconductor film is formed is not particularly limited as long as it can withstand a treatment temperature of this manufacturing process. For a glass substrate, a glass material such as aluminosilicate glass, aluminoborosilicate glass, or barium borosilicate glass is used, for example. Note that, a glass substrate containing BaO and $B_2O_3$ so that an amount of BaO is larger than that of $B_2O_3$ is preferably used.

Also, instead of the above-mentioned glass substrate, a ceramic substrate such as an yttria-stabilized zirconia (YSZ) substrate, or a substrate made of an insulator such as a sapphire substrate may be used, as well as a monocrystalline substrate with a lattice constant that is close to that of an oxide semiconductor film that is also formed. Furthermore, an organic substrate such as a plastic substrate, a substrate obtained by forming an insulating film over a surface of a semiconductor substrate such as a silicon wafer or a surface of a conductive substrate formed of a metal material can be used, instead of a quartz substrate or a crystallized glass substrate.

Next, an oxide semiconductor film is formed over a substrate. An oxide semiconductor in this embodiment refers to single-component oxide semiconductors and all multi-component oxide semiconductors, and as the single-component oxide semiconductors, In—O-based, Sn—O-based, Zn—O-based oxide semiconductors and the like can be given, and as the multi-component oxide semiconductors, In—Sn—Ga—Zn—O-based, In—Ga—Zn—O-based, In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based oxide semiconductors and the like can be given.

Formation of the oxide semiconductor film is performed in the atmosphere in which oxygen is purposely not contained. Specifically, it is preferably performed in a rare gas (argon, helium, neon, xenon, or krypton) atmosphere or a nitrogen atmosphere.

Also, as a formation method of the oxide semiconductor film, a sputtering method, a vacuum evaporation method, an electron beam evaporation method (EB evaporation method), a molecular beam epitaxy method (MBE method), a reaction deposition epitaxy method (RDE method), a laser ablation method, and the like can be given. Note that, in the case of using a vacuum evaporation method or an electron beam evaporation method (EB evaporation method), by performing film formation in a high vacuum of $10^{-4}$ Pa or less, a desired oxide semiconductor film can be formed.

Also, the above-mentioned methods may be performed while heating or not heating the substrate; however, by forming the oxide semiconductor while heating the substrate, heat energy from the substrate can be used for forming a crystal lattice, which is preferable. Furthermore, it is preferable that heating of the substrate during formation is performed at a high temperature.

Next, a heat treatment is performed to perform crystallization. In this embodiment in particular, the heat treatment is performed at 600° C. or higher to crystallize the oxide semiconductor film. It is necessary to perform this heat treatment in the atmosphere or in an atmosphere containing oxygen. Here, for the crystallization, the heat treatment is performed for 1 hour in the atmosphere.

A heat treatment apparatus used for the heat treatment is not particularly limited, and the apparatus may be provided with a device for heating the substrate by heat conduction or heat radiation from a heating element such as a resistance heating element. For example, as the heat treatment apparatus, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating a substrate by radiation of light (electromagnetic waves) emitted form a lamp such as a halogen lamp, a metal halide lamp, a xenon arc lamp, a carbon arc lamp, a high-pressure sodium lamp, or a high-pressure mercury lamp. A GRTA apparatus is an apparatus for performing a heat treatment using a high-temperature gas. Also, the heat treatment can be performed by laser irradiation by an excimer laser or the like.

By the above-mentioned heat treatment, an oxide semiconductor film with high crystallinity can be obtained. This result is obtained because the oxide semiconductor film before crystallization is an oxide semiconductor film that is formed in the atmosphere in which oxygen is purposely not contained.

In the above manner, by forming the oxide semiconductor film in the atmosphere in which oxygen is purposely not contained, an oxygen-deficient oxide semiconductor film is formed, and then by performing the heat treatment, crystallization is accelerated.

It is speculated that by forming the oxide semiconductor film in the atmosphere in which oxygen is purposely not contained, oxygen deficiency occurs in the oxide semiconductor film that is formed, atom density of the oxide semiconductor film is reduced, and a structure with many spaces is formed. Furthermore, it is speculated that when the oxide semiconductor film with a structure with many spaces is subjected to the heat treatment, it becomes easier for constituent atoms of the oxide semiconductor to move over a substrate surface; therefore, it becomes easier for a crystal lattice to be formed, and crystallization is accelerated.

Also, by performing the heat treatment for crystallizing the oxide semiconductor film in an atmosphere containing oxygen, oxygen is supplied to an oxide semiconductor film, and oxygen deficiency in the oxide semiconductor film is compensated. This is also visually confirmed. An oxide semiconductor film with little oxygen deficiency and a wide bandgap is clear and colorless, but an oxide semiconductor film formed in the atmosphere in which oxygen is purposely not contained absorbs visible light and becomes brown. The brown oxide semiconductor film becomes an original transparent oxide semiconductor film by performing the heat treatment in an atmosphere containing oxygen.

Crystallinity of the oxide semiconductor film can be evaluated by X-ray diffraction (XRD). From a result of X-ray diffraction, in the oxide semiconductor film formed in the atmosphere in which oxygen is purposely not contained, an X-ray diffraction peak is observed which indicates that crystallization occurs while orienting with a c-axis with respect to the substrate. Furthermore, by using a Hall effect measurement method or a capacitance voltage measurement method (C-V measurement method), it can be confirmed that carrier density is less than $1 \times 10^{14}/cm^3$. Consequently, it can be confirmed that an oxide semiconductor film with high crystallinity is obtained.

(Description of C-V Measurement Method)

The carrier density of an oxide semiconductor film described in this specification can be calculated by manufacturing a MOS capacitor using an oxide semiconductor film and then evaluating a result (C-V characteristic) of a capacitance voltage measurement (C-V measurement) of the MOS capacitor. Measurement of the carrier density is performed in the following steps (1) to (3). (1) A C-V characteristic which plots a gate voltage Vg and a capacitance C of the MOS capacitor is obtained. (2) A graph which plots a relationship between the gate voltage Vg and $(1/C)^2$ is obtained from the C-V characteristic, and a derivative value of $(1/C)^2$ in a weak inversion region in the graph is calculated. (3) The obtained derivative value is substituted for Formula (1) below expressing a carrier density Nd. Note that in Formula (1), e represents elementary charge, $\epsilon_0$ represents vacuum permittivity, and $\epsilon$ represents relative permittivity of an oxide semiconductor.

[Formula 1]

$$N_d = -\left(\frac{2}{e\epsilon_0\epsilon}\right) \bigg/ \frac{d(1/C)^2}{dV} \quad (1)$$

By the above steps, carrier density in the oxide semiconductor film can be calculated.

(Embodiment 2)

The manufacturing method of an oxide semiconductor film with high crystallinity described in Embodiment 1 can be applied to an oxide semiconductor film in which two or more layers are laminated, as well as to a single-layer oxide semiconductor film.

In this embodiment, a method of crystallizing a two-layer oxide semiconductor film will be described with reference to FIGS. 1A to 1D.

Figure 1A:
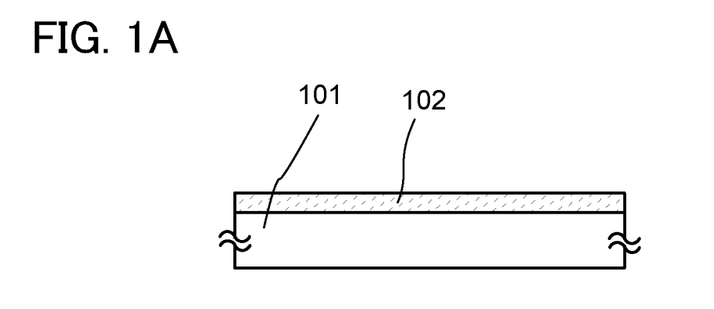
FIGS. 1A to 1D are cross-sectional views illustrating a crystallization process according to one embodiment of the present invention.
Figure 1B:
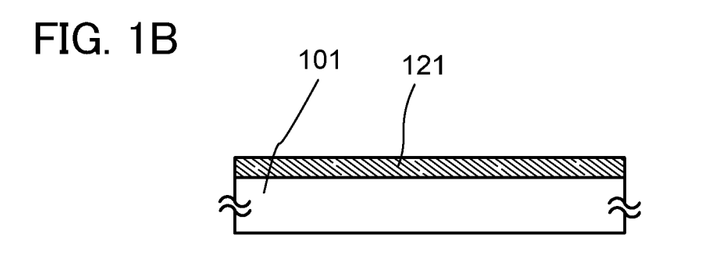
Figure 1C:
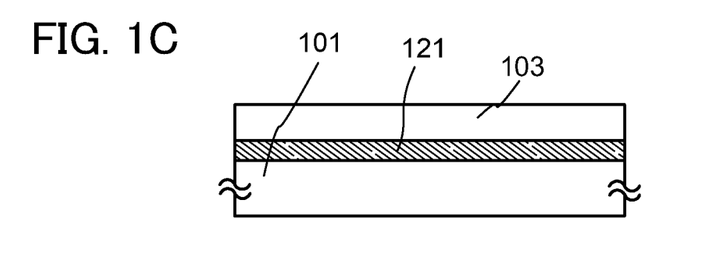
Figure 1D:
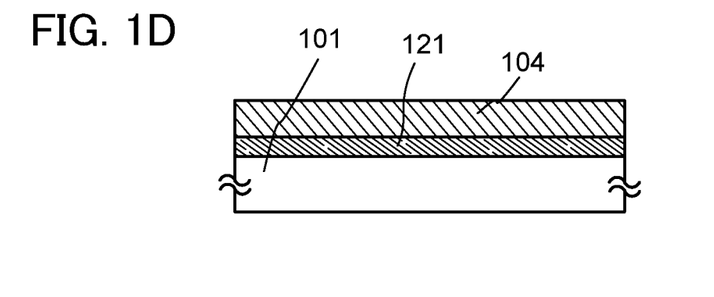

In this embodiment, after forming a first oxide semiconductor film 102 so as to be in contact with a substrate 101 as shown in FIG. 1A, the first oxide semiconductor film 102 is subjected to a heat treatment, thereby forming a crystallized first oxide semiconductor film 121 shown in FIG. 1B. Next, a second oxide semiconductor film 103 is formed in the atmosphere in which oxygen is purposely not contained so as to be in contact with the crystallized first oxide semiconductor film 121 as shown in FIG. 1C, and then subjected to a heat treatment in an atmosphere containing oxygen, to crystallize the second oxide semiconductor film 103 that is laminated over the crystallized first oxide semiconductor film 121 and to obtain a second oxide semiconductor film 104 with high crystallinity, as illustrated in FIG. 1D.

Since the second oxide semiconductor film 103 can be crystallized by using the crystallized first oxide semiconductor film 121 as a seed crystal, even in the case that a multi-component oxide semiconductor film such as an In—Ga—Zn—O-based oxide semiconductor film which is considered difficult to crystallize is used as the second oxide semiconductor film 103, the second oxide semiconductor film 103 can be easily crystallized. For example, a Zn—O-based oxide semiconductor film can be used as the first oxide semiconductor film 102, and an In—Ga—Zn—O-based oxide semiconductor film can be used as the second oxide semiconductor film 103. Note that for the first oxide semiconductor film 102, it is preferable to use an oxide semiconductor that has the same crystal structure as the second oxide semiconductor film 103 as well as has a lattice constant that is close to that of the second oxide semiconductor film 103.

The first oxide semiconductor film 102 and the second oxide semiconductor film 103 can be formed of oxide semiconductor films with different constituent elements or oxide semiconductor film with the same constituent elements but with different composition ratios. Note that the first oxide semiconductor film 102 and the second oxide semiconductor film 103 may be formed of the same oxide semiconductor with the same constituent elements with the same composition ratio. This means that the same oxide semiconductor film may be formed twice as the first oxide semiconductor film 102 and the second oxide semiconductor film 103.

As a substrate over which the oxide semiconductor of this embodiment is formed, the same substrate as that described in Embodiment 1 can be used.

As the first oxide semiconductor film 102, the same film as that described in Embodiment 1 can be used. Although it is preferable to use as the first oxide semiconductor film 102 an Zn—O-based oxide semiconductor or the like which is easily crystallized, a multi-component oxide semiconductor film such as an In—Ga—Zn—O-based oxide semiconductor film which is not easily crystallized can be used as the first oxide semiconductor film by making a thickness thereof to be thin to an extent that makes crystallization easy. Specifically, the thickness is preferably less than 10 nm Also, a formation method of the first oxide semiconductor film 102 is not particularly limited, and a sputtering method, a vacuum evaporation method, an electron beam evaporation method (EB evaporation method), a molecular beam epitaxy method (MBE method), a reaction deposition epitaxy method (RDE method), a laser ablation method, and the like can be given. For example, by a sputtering method, film formation may be performed in an atmosphere containing oxygen, a rare gas (typically argon) atmosphere, or in an atmosphere in which oxygen is purposely not contained such as a nitrogen atmosphere.

Also, although formation of the first oxide semiconductor film 102 may be performed while heating the substrate or not heating the substrate, by forming the first oxide semiconductor film 102 while heating the substrate, heat energy from the substrate can be used for aligning a crystal lattice, which is preferable. Furthermore, it is preferable that heating of the substrate during formation is performed at a high temperature.

Next, the first oxide semiconductor film 102 is subjected to a heat treatment to perform crystallization. In this embodiment in particular, the heat treatment is performed at 600° C. or higher to perform crystallization. Although is it possible to perform this heat treatment in an inert gas atmosphere, it is preferably performed in the atmosphere or in an atmosphere containing oxygen, and here, the heat treatment is performed in the atmosphere for 1 hour. By this process, the crystallized first oxide semiconductor film 121 can be obtained. Note that, if the first oxide semiconductor film 102 that is formed while heating the substrate is crystallized to an extent that it can function as a seed crystal for crystallizing the second oxide semiconductor film 103, the heat treatment can be omitted.

A heat treatment apparatus used in the heat treatment is not particularly limited, and the apparatus described in Embodiment 1 can be used.

Next, the second oxide semiconductor film 103 is formed over the crystallized first oxide semiconductor film 121. The second oxide semiconductor film 103 is formed in the atmosphere in which oxygen is purposely not contained. Also, for the second oxide semiconductor film 103, a multi-component oxide semiconductor such as an In—Ga—Zn—O-based oxide semiconductor film which is not easily crystallized may be used.

For the second oxide semiconductor film 103, it is preferable to use an oxide semiconductor film that has the same crystal structure as the crystallized first oxide semiconductor film 121 as well as has a lattice constant that is close to that of the crystallized first oxide semiconductor film 121, because the second oxide semiconductor film 103 can be crystallized more easily.

As a method of forming the second oxide semiconductor film 103 in the atmosphere in which oxygen is purposely not contained, the method described in Embodiment 1 can be performed. Also, although formation of the second oxide semiconductor film 103 may be performed while heating the substrate or not heating the substrate, by forming the second oxide semiconductor film 103 while heating the substrate, heat energy from the substrate can be used for aligning a crystal lattice, which is preferable. Furthermore, it is preferable that heating of the substrate is performed at a high temperature.

Next, the second oxide semiconductor film 103 that is laminated over the crystallized first oxide semiconductor film 121 is subjected to a heat treatment, and the second oxide semiconductor film 103 is crystallized. In this embodiment in particular, the heat treatment is performed at 600° C. or higher to perform crystallization. This heat treatment is preferably performed in the atmosphere or in an atmosphere containing oxygen, and here, the heat treatment is performed in the atmosphere for 1 hour.

A heat treatment apparatus used in the heat treatment is not particularly limited, and the apparatus described in Embodiment 1 can be used.

By the above-mentioned heat treatment, the second oxide semiconductor film 104 with high crystallinity can be obtained as shown in FIG. 1D.

In the above manner, by forming the second oxide semiconductor film 103 over the crystallized first oxide semiconductor film 121 in the atmosphere in which oxygen is purposely not contained, that is, by forming the second oxide semiconductor film 103 that is oxygen deficient over the crystallized first oxide semiconductor film 121 and then performing the heat treatment, crystallization of the second oxide semiconductor film 103 is accelerated.

It is speculated that by forming the second oxide semiconductor film 103 over the crystallized first oxide semiconductor film 121 in the atmosphere in which oxygen is purposely not contained, oxygen deficiency occurs in the second oxide semiconductor film 103 that is formed, atom density of the oxide semiconductor film is reduced, and a structure with many spaces is formed. Furthermore, it is speculated that when the oxide semiconductor film with a structure with many spaces is subjected to the heat treatment, it becomes easier for constituent atoms of the oxide semiconductor film to move over a substrate surface; therefore, it becomes easier for a crystal lattice to be formed, and crystallization is accelerated.

Also, by performing the heat treatment for crystallizing the oxide semiconductor film in an atmosphere containing oxygen, oxygen is supplied to an oxide semiconductor film, and oxygen deficiency in the oxide semiconductor film is compensated. This is also visually confirmed. An oxide semiconductor film with little oxygen deficiency and a wide bandgap is clear and colorless, but an oxide semiconductor film formed in the atmosphere in which oxygen is purposely not contained absorbs visible light and becomes brown. The brown oxide semiconductor film becomes an original transparent oxide semiconductor film by performing the heat treatment in an atmosphere containing oxygen.

In this embodiment also, crystallinity can be evaluated by the same method as that described in Embodiment 1. From a result of X-ray diffraction, in the second oxide semiconductor film 104 with high crystallinity, an X-ray diffraction peak is obtained which indicates that crystallization occurs while orienting with a c-axis with respect to the substrate surface. Furthermore, from a result of a Hall effect measurement method or a capacitance voltage measurement method (C-V measurement method), it can be confirmed that carrier density is less than $1 \times 10^{14}/cm^3$.

Furthermore, in the step in which the second oxide semiconductor film is crystallized by the heat treatment, it is written above that only the second oxide semiconductor film is crystallized. However, in the case that there is an amorphous region contained in the crystallized first oxide semiconductor film 121, in the step in which the second oxide semiconductor film is crystallized by the heat treatment, the first oxide semiconductor film is crystallized even more, and then the second oxide semiconductor film is crystallized. For example, regarding the first oxide semiconductor film that is formed in an atmosphere containing oxygen and then crystallized, by forming the second oxide semiconductor film in the atmosphere in which oxygen is purposely not contained and then performing the heat treatment in an atmosphere containing oxygen, crystallinity of the first oxide semiconductor film can also be improved. Therefore, one embodiment of the present invention includes a structure in which the first oxide semiconductor film and the second oxide semiconductor film are crystallized.

Also, in this embodiment, after forming the first oxide semiconductor film and the second oxide semiconductor film, the first oxide semiconductor film and the second oxide semiconductor film can be crystallized by a heat treatment in which heating is done at a first temperature and a second temperature. In this case, it is necessary that the first oxide semiconductor film is an oxide semiconductor film that is crystallized more easily than the second oxide semiconductor film. For example, the first oxide semiconductor film is an oxide semiconductor film that is crystallized at a lower temperature than the second oxide semiconductor film.

Note that although a manufacturing method of a two-layer oxide semiconductor film that is crystallized is described in this embodiment, a laminated oxide semiconductor film is not limited thereto, and for an oxide semiconductor film in which two or more layers are laminated, at least one layer of the laminated oxide semiconductor film can be formed in the atmosphere in which oxygen is purposely not contained and then subjected to a heat treatment in an atmosphere containing oxygen, thereby crystallizing the laminated oxide semiconductor film.

The structure, method, and the like described in this embodiment can be used in combination with structures, methods, and the like described in other embodiments and examples, as appropriate.

(Embodiment 3)

In this embodiment, a manufacturing method of a transistor including the oxide semiconductor films described in Embodiment 1 and Embodiment 2 will be described with reference to FIGS. 2A to 2E.

FIGS. 2A to 2E are cross-sectional views relating to a manufacturing process of a transistor. Note that a transistor 110 described herein is an inversed staggered transistor.

Hereinafter, a process of manufacturing the transistor 110 over a substrate 105 will be described with reference to FIGS. 2A to 2E.

Figure 2A:
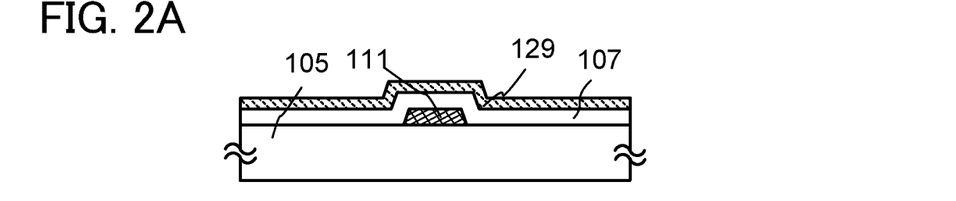
FIGS. 2A to 2E are cross-sectional views illustrating a manufacturing process of a transistor according to one embodiment of the present invention.

First, a gate electrode 111 is formed over the substrate 105.

As described in the above embodiments, it is necessary that the substrate 105 with an insulating surface has heat resistance that can withstand at least a heat treatment that is performed later. For example, in the case that a glass substrate is used as the substrate 105, a substrate with a strain point at 730° C. or higher is preferably used. As the glass substrate, for example, a glass material such as aluminosilicate glass, aluminoborosilicate glass, or barium borosilicate glass is used. Note that by the glass substrate containing more barium oxide (BaO) than boron oxide ($B_2O_3$), a more practical heat-resistant glass can be obtained. Therefore, a glass substrate containing a larger amount of barium oxide than boron oxide is preferably used. Also, instead of the glass substrate, a substrate formed of an insulator such as a ceramic substrate, a quartz substrate, or a sapphire substrate can be used. Alternatively, crystallized glass or the like can be used. Further alternatively, a substrate obtained by forming an insulating film over a surface of a semiconductor substrate such as a silicon wafer or a conductive substrate made of a metal material can be used. In this embodiment, a glass substrate is used as the substrate 105.

Note that an insulating film functioning as a base may be provided between the substrate 105 and the gate electrode 111. The insulating film has a function of preventing diffusion of an impurity element from the substrate 105, and can be formed of one or a plurality of films selected from a silicon nitride film, a silicon oxide film, a silicon nitride oxide film, a silicon oxynitride film, and the like.

The gate electrode 111 is formed in a first photolithography step and an etching step after forming a conductive film described below. The conductive film can be formed by using a metal material such as molybdenum, titanium, chromium, tantalum, tungsten, aluminum, copper, neodymium, or scandium, or an alloy material containing any of these materials as a main component. Alternatively, a semiconductor typified by polycrystalline silicon doped with an impurity element such as phosphorus may be used. A structure thereof may be a single-layer structure or a laminated structure. Also, in the case that aluminum or copper is used for the conductive film, it is preferably used in combination with a refractory metal material in order to avoid problems of heat resistance and corrosion. Note that to form the conductive film, a sputtering method, a vacuum evaporation method, a CVD method, or the like can be used.

Also, a resist mask used in the first photolithography step may be formed by an inkjet method. Since a photomask is not used when the resist mask is formed by an inkjet method, manufacturing cost can be reduced. Note that, by an end portion of the gate electrode 111 having a tapered form, coverage with a gate insulating film 107 that is formed later is improved, which is preferable. In the case of using a photolithography step, the taper form can be obtained by etching while backing off the resist mask.

Next, the gate insulating film 107 is formed over the gate electrode 111. The gate insulating film 107 can be formed by using a plasma CVD method, a sputtering method, or the like. The gate insulating film 107 can be formed as a single layer or a laminated layer of one or a plurality of films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, a gallium oxide film, and the like. In this embodiment, as the gate insulating film 107, a silicon oxide film is formed by a sputtering method. Note that when forming silicon oxide by the sputtering method, it can be performing while heating the substrate.

To avoid hydrogen, a hydroxyl group, and moisture from getting contained in the gate insulating film 107 as much as possible, as a pretreatment for forming the gate insulating film 107, it is preferable to preheat the substrate 105 over which the gate electrode 111 is formed to desorb an impurity such as hydrogen or moisture that is adsorbed to the substrate 105. Also, an exhaust means that is provided in a preheating chamber is preferably an entrapment vacuum pump which will be described later. Furthermore, the preheating may be performed on the substrate 105 over which up to a source electrode 115a and a drain electrode 115b are formed. Note that this preheating treatment can be omitted.

Next, an oxide semiconductor film 129 with a thickness of 2 nm or more and 200 nm or less, preferably 5 nm or more and 30 nm or less, is formed over the gate insulating film 107.

For the oxide semiconductor film 129, a single-component oxide semiconductor and a multi-component oxide semiconductor described in the above embodiments can be formed by the method described in the above embodiments. Note that in this embodiment, an In—Ga—Zn—O-based oxide semiconductor is formed using a sputtering method.

As one example of a target for forming the oxide semiconductor film 129 by a sputtering method, an oxide target with a composition ratio of $In_2O_3:Ga_2O_3:ZnO=1:1:1$ [molar ratio] can be used. Materials and composition of the target is not limited thereto, and for example, an oxide target with a composition ratio of $In_2O_3:Ga_2O_3:ZnO=1:1:2$ [molar ratio] or $In_2O_3:Ga_2O_3:ZnO=1:1:4$ [molar ratio] may be used.

In this embodiment, an oxide semiconductor film that is to be crystallized is formed by a sputtering method using an In—Ga—Zn—O-based metal oxide target.

Relative density of a metal oxide in the metal oxide target is 80% or higher, preferably 95% or higher, and even more preferably 99.9% or higher. A metal oxide target with high relative density is used.

A formation atmosphere of the oxide semiconductor film 129 is an atmosphere in which oxygen is purposely not contained, that is, a gas atmosphere containing only a rare gas typified by argon. Specifically, it is favorable to use a high-purity gas atmosphere in which an impurity such as hydrogen, water, a hydroxyl group, or a hydride is removed down to a concentration of 1 ppm or lower (desirably to a concentration of 10 ppb or lower).

When forming the oxide semiconductor film 129, the substrate 105 is held in a treatment chamber that is maintained in a reduced-pressure state, and the substrate 105 is heated so that a temperature of the substrate 105 reaches 100° C. or higher and lower than 550° C., preferably 200° C. or higher and 400° C. or lower, or the temperature of the substrate 105 may be set at room temperature (15° C. or higher and 35° C. or lower). Furthermore, it is preferable that the oxide semiconductor film 129 is formed using the above-mentioned target, by introducing a high-purity gas from which hydrogen, water, or the like is removed into the treatment chamber while moisture in the treatment chamber is removed. By forming the oxide semiconductor film 129 while heating the substrate 105, an impurity contained in the oxide semiconductor film can be reduced.

Moreover, damage due to sputtering can be reduced. Note that to remove hydrogen or moisture in the treatment chamber, an entrapment vacuum pump is preferably used. For example, a cryopump, an ion pump, a titanium sublimation pump, or the like can be used. A turbo pump provided with a cold trap may be used. By evacuating using the cryopump or the like, hydrogen, water, or the like can be removed from the treatment chamber, and an impurity concentration in the oxide semiconductor film 129 can be reduced.

Formation conditions for the oxide semiconductor film 129 are, for example, a distance of 60 mm between the substrate 105 and the target, a pressure of 0.4 Pa, a direct current (DC) power of 0.5 kW, and an argon (100% argon) atmosphere. Note that, it is preferable that a pulsed direct current (DC) power source is used because particles can be reduced and film thickness distribution becomes even. The thickness of the oxide semiconductor film 129 is set at 1 nm or more and 50 nm or less, preferably 1 nm or more and 30 nm or less, and even more preferably 1 nm or more and 10 nm or less. By forming the oxide semiconductor film 129 to have this thickness, a short channel effect that results from miniaturization can be suppressed. However, since the appropriate thickness differs depending on an oxide semiconductor material to be applied, a use of a semiconductor device, and the like, the thickness of the oxide semiconductor film 129 can be appropriately selected depending on the material to be used, the use, and the like.

Note that before forming the oxide semiconductor film 129 by a sputtering method, reverse sputtering is performed by which plasma is generated by introducing argon gas, and particles attached to a surface of the gate insulating film 107 are removed, so that resistance at an interface between the gate insulating film 107 and the oxide semiconductor film 129 is reduced. The reverse sputtering refers to a method of modifying a surface of a substrate by applying a voltage to the substrate using an RF power source in an argon atmosphere to form plasma in a vicinity of the substrate. Note that instead of the argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used. Note that as described in the above embodiments, when forming the oxide semiconductor film, it is preferably performed in an argon atmosphere. Steps up to this point are shown in FIG. 2A.

Figure 2B:
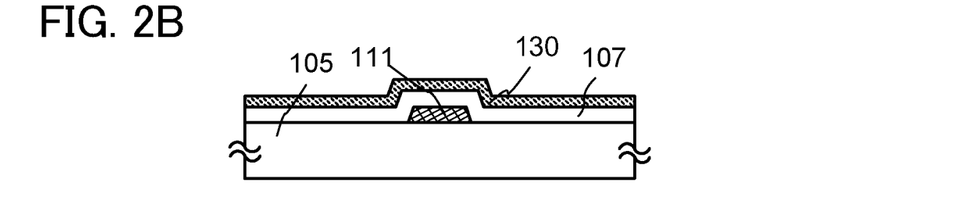

Next, a first heat treatment is performed on the oxide semiconductor film 129 that is formed, and an oxide semiconductor film 130 with high crystallinity is formed. A heat treatment is performed at 600° C. or higher to crystallize the oxide semiconductor film 129. Since in this heat treatment, crystallization is performed while compensating oxygen for an oxygen deficiency of the oxide semiconductor film 129, it is preferably performed in the atmosphere or in an atmosphere containing oxygen, and here, the heat treatment is performed in the atmosphere at 650° C. for 1 hour.

Note that in this step, along with crystallizing the oxide semiconductor film 129, an impurity (for example, hydrogen, water, or a hydroxyl group) in the oxide semiconductor film 129 can be removed. That is, a hydrogen concentration of the oxide semiconductor film 130 with high crystallinity is reduced by the first heat treatment, and a donor level or a defect level in a bandgap of the oxide semiconductor film 130 with high crystallinity can be reduced.

A heat treatment apparatus used for the heat treatment is not limited as long as it is an apparatus with which the heat treatment is performed by heat conduction or heat radiation from a heating element such as a resistance heating element. For example, as the heat treatment apparatus, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for performing a heat treatment by radiation of light (electromagnetic waves) emitted form a lamp such as a halogen lamp, a metal halide lamp, a xenon arc lamp, a carbon arc lamp, a high-pressure sodium lamp, or a high-pressure mercury lamp. A GRTA apparatus is an apparatus for performing a heat treatment using a high-temperature gas. Also, the heat treatment can be performed by laser irradiation by an excimer laser or the like. By the above heat treatment step, the oxide semiconductor film 130 with high crystallinity can be obtained. This step is shown in FIG. 2B.

In the first heat treatment, an impurity in the oxide semiconductor film 129 is reduced, and the oxide semiconductor film 130 that is i-type (intrinsic semiconductor) or extremely close to being i-type is formed. Furthermore, by using for a transistor the oxide semiconductor film 130 that is i-type (intrinsic semiconductor) or extremely close to being i-type, the transistor can be a transistor with an excellent characteristic.

Note that the first heat treatment may be performed after processing into an island-shaped oxide semiconductor film which will be described later, or the first heat treatment may be performed multiple times instead of once.

In this embodiment, although the crystallized, single-layer oxide semiconductor film 130 is used as an oxide semiconductor film used in a channel region of a transistor, the oxide semiconductor film used in a channel region of a transistor can be the crystallized and laminated oxide semiconductor film described in Embodiment 2.

Figure 2C:
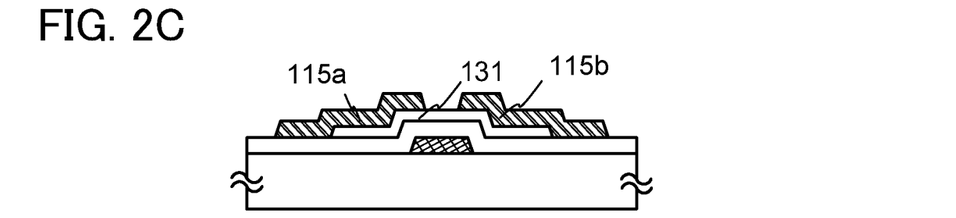

Next, the oxide semiconductor film 130 is processed into an island-shaped oxide semiconductor film 131 by a second photolithography step and an etching step. Note that a resist mask used in the photolithography step may be formed by an inkjet method. Since a photomask is not used when the resist mask is formed by an inkjet method, manufacturing cost can be reduced.

Note that in the case of forming a contact hole in the gate insulating film 107, a step of forming the contact hole can be performed at the same time as processing of the oxide semiconductor film 130.

The etching step of the oxide semiconductor film 130 may be dry etching or wet etching, or both may be performed. For example, as an etchant used for wet etching of the oxide semiconductor film 130, a mixed solution of phosphoric acid, acetic acid, and nitric acid, or an ammonium hydroxide-hydrogen peroxide mixture (31 wt % hydrogen peroxide solution:28 wt % ammonia water:water=5:2:2 (volume ratio)) can be used. Also, ITO07N (manufactured by Kanto Chemical Co., Inc.) may be used.

Note that a second heat treatment can be performed after forming a source electrode and a drain electrode which will be described later, after forming an insulating film over the source electrode and the drain electrode, or the like.

Next, a conductive film which becomes the source electrode 115a and the drain electrode 115b (including a wiring that can be formed at the same time) is formed over the gate insulating film 107 and the island-shaped oxide semiconductor film 131. As the conductive film used for the source electrode 115a and the drain electrode 115b, the conductive film described for the gate electrode 111 can be used. In this embodiment, a titanium film is used as the conductive film.

After a resist mask is formed over the conductive film by a third photolithography step and then the source electrode 115a and the drain electrode 115b are formed by performing selective etching, the resist mask is removed (see FIG. 2C).

Light exposure during formation of the resist mask in the third photolithography step may be performed using ultraviolet light, KrF laser light, or ArF laser light. Note that channel length of the transistor is determined by a distance between a source electrode layer and a drain electrode layer. Therefore, for light exposure during formation of a mask that is used in manufacturing a transistor with a channel light of less than 25 nm, extreme ultraviolet light with a short wavelength of several nanometers to several tens of nanometers is desirably used. In the light exposure by extreme ultraviolet light, resolution is high and focus depth is large. Therefore, the channel length of the transistor can be 10 nm or more and 1000 nm (1 μm) or less, and operation speed of a circuit can be increased. Furthermore, power consumption of a semiconductor device can be reduced by miniaturization.

Also, to reduce the number of photomasks and the number of steps in the photolithography process, the etching step may be performed using a resist mask formed by a multi-tone mask. Since a resist mask formed using a multi-tone mask has regions with different thicknesses and can be further changed in shape by performing etching, the resist mask can be used in multiple etching steps to provide different patterns. Therefore, a resist mask corresponding to at least two or more kinds of different patterns can be formed by one multi-tone mask. With this, the number of light-exposure masks can be reduced and the number of corresponding photolithography steps can also be reduced, whereby simplification of a process is possible.

Note that when etching the conductive film that functions as the source electrode 115a and the drain electrode 115b, it is desirable that an etching condition is optimized so that the island-shaped oxide semiconductor film 131 does not get divided by the etching. However, it is difficult to obtain such a condition in which only the conductive film is etched and the island-shaped oxide semiconductor film 131 is not etched at all, and when etching the conductive film, there are cases in which a portion of the island-shaped oxide semiconductor film 131 is etched and a groove portion (a depressed portion) is formed.

For etching of the conductive film functioning as the source electrode 115a and the drain electrode 115b, wet etching or dry etching may be performed. Note that from a viewpoint of miniaturizing an element, dry etching is preferably used. An etching gas and an etchant can be appropriately selected depending on a material that is to be etched. In this embodiment, a titanium film is used as the conductive film and an In—Ga—Zn—O-based oxide semiconductor is used for the island-shaped oxide semiconductor film 131; therefore, in the case of applying wet etching for example, an ammonium hydroxide-hydrogen peroxide mixture (a mixed solution of ammonia, water, and hydrogen peroxide solution) can be used.

Also, it is desirable to remove hydrogen, water, and the like that is attached to a surface of the island-shaped oxide semiconductor film 131 that is exposed, by performing a plasma treatment using a gas such as $N_2O$, $N_2$, or Ar.

Figure 2D:
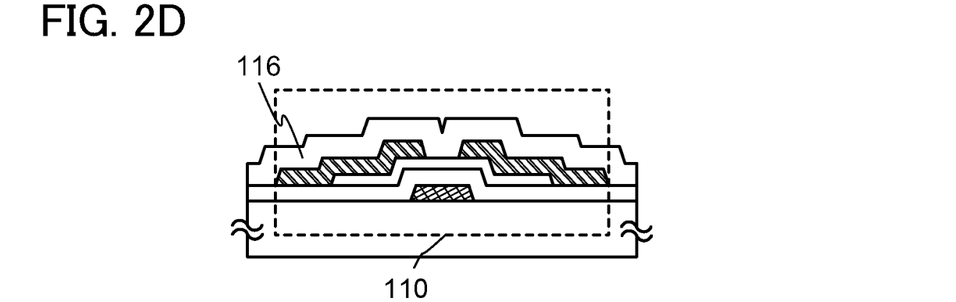

Next, an insulating film 116 is formed over the gate insulating film 107, the island-shaped oxide semiconductor film 131, the source electrode 115a and the drain electrode 115b. It is desirable that the insulating film 116 is formed to have a thickness of at least 1 nm or more, in a manner that an impurity such as water or hydrogen does not get mixed into the insulating film 116. One example of a formation method of the insulating film 116 is a sputtering method performed under a condition of no exposure to the atmosphere. When hydrogen gets into the insulating film 116, resistance of a back-channel region of the island-shaped oxide semiconductor film 131 is reduced (turns into n-type) due to the hydrogen entering the island-shaped oxide semiconductor film 131, the hydrogen extracting oxygen that is in the island-shaped oxide semiconductor film 131, or the like, and there is concern of a parasitic channel region getting formed in the island-shaped oxide semiconductor film 131. In view of this, for the insulating film 116, it is desirable to use an insulating film containing oxygen, such as a silicon oxide film, a silicon oxynitride film, an aluminum oxide film, or an aluminum oxynitride film.

In this embodiment, a silicon oxide film with a thickness of 200 nm is formed as the insulating film 116 by a sputtering method, with a temperature of the substrate at 100° C. Note that the insulating film 116 can be formed while heating the substrate, and the temperature of the substrate can be set at room temperature (25° C.) or higher and 300° C. or lower. Formation of the silicon oxide film is preferably performed in a rare gas (typically argon) atmosphere, an oxygen atmosphere, or in a mixed gas atmosphere of a rare gas and oxygen gas, and a silicon oxide target or a silicon target can be used as a target. Furthermore, a gas that is used when forming the silicon oxide film is desirably a high-purity gas from which an impurity such as hydrogen or water is removed.

Furthermore, in the same manner as with the gate insulating film 107 and the oxide semiconductor film 129, in order to reduce concentration of an impurity contained in the insulating film 116, in the case of forming the silicon oxide film by a sputtering method, it is preferable to remove residual moisture in the treatment chamber using an entrapment vacuum pump (such as a cryopump).

Next, the second heat treatment is performed in an inert gas atmosphere or in an oxygen atmosphere. The same apparatus as the apparatus used in the first heat treatment can be used as a heat treatment apparatus. Also, the higher the heating temperature, the more suppressed an amount of change becomes in a threshold voltage (Vth) due to light irradiation or application of BT stress. However, because degradation of an ON characteristic occurs when the heating temperature is increased past 320° C., the heating temperature is set at 200° C. or higher and 450° C. or lower, desirably at 250° C. or higher and 350° C. or lower. For example, the heat treatment may be performed in a nitrogen atmosphere at 250° C. for 1 hour. By performing the second heat treatment, change (variation) in an electrical characteristic of the transistor can be suppressed. Also, because the insulating film 116 contains oxygen, oxygen deficiency of the island-shaped oxide semiconductor film 131 is compensated by oxygen being supplied to the island-shaped oxide semiconductor film 131 from the insulating film 116 in the same manner as in the first heat treatment.

Note that in this embodiment, although the second heat treatment is performed after forming the insulating film 116, as long as the second heat treatment is performed in an oxygen atmosphere, the timing of the second heat treatment is not limited thereto. For example, the second heat treatment may be performed following the first heat treatment. Furthermore, by making the first heat treatment to also function as the second heat treatment, the second heat treatment can be omitted. However, if the second heat treatment is performed in an inert gas atmosphere, it is necessary to perform the second heat treatment after forming the insulating film 116.

That is, by the first heat treatment and the second heat treatment, the island-shaped oxide semiconductor film 131 can be highly purified so that an impurity other than a main component thereof is not contained as much as possible, thereby forming an oxide semiconductor film that is i-type (intrinsic) or extremely close to being i-type.

Through the above process, the transistor 110 is formed (see FIG. 2D).

Figure 2E:
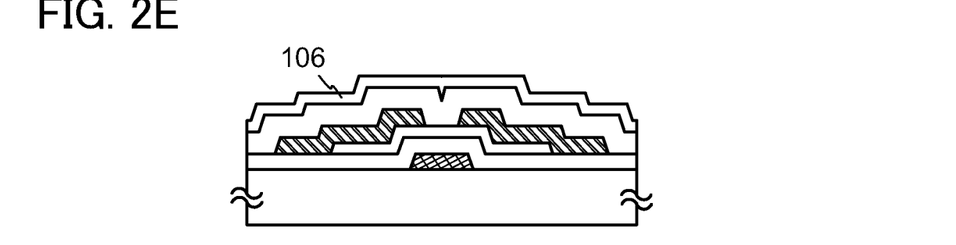

Note that a protective insulating film 106 is desirably formed over the insulating film 116 (see FIG. 2E). The protective insulating film 106 prevents hydrogen, water, or the like from entering from outside. As the protective insulating film 106, a silicon nitride film, an aluminum nitride film, or the like can be used, for example. Although a formation method is not particularly limited, an RF sputtering method is suited as the formation method of the protective insulating film 106 because productivity is excellent.

Note that after forming the protective insulating film 106, a heat treatment may additionally be performed in the atmosphere at 100° C. or higher and 200° C. or lower, for 1 hour or more and 30 hours or less.

In this manner, by using an oxide semiconductor film with high crystallinity as a channel region of a transistor, field effect mobility of the transistor 110 can be improved.

The structures, methods, and the like described in this embodiment can be appropriately combined with structures, methods, and the like of other embodiments and examples.

EXAMPLE 1

In this example, crystallinity of an oxide semiconductor film formed by a manufacturing method of one embodiment of the present invention is described.

First, an In—Ga—Zn—O-based oxide semiconductor (hereinafter referred to as IGZO) with a thickness of 500 nm was formed over a glass substrate by a sputtering method without heating the substrate. A target composition of IGZO was $In_2O_3$: $Ga_2O_3$:ZnO=1:1:1 [molar ratio], and application voltage and application pressure during formation were 0.5 kw and 0.4 Pa, respectively.

At this time, an atmosphere gas (argon gas and oxygen gas) supplied during formation was set under the following five conditions 1 to 5.
(Condition 1)
argon:oxygen=45 sccm:0 sccm
(Condition 2)
argon:oxygen=35 sccm:10 sccm
(Condition 3)
argon:oxygen=25 sccm:20 sccm
(Condition 4)
argon:oxygen=15 sccm:30 sccm
(Condition 5)
argon:oxygen=5 sccm:40 sccm Next, each of IGZO films formed under Conditions 1 to 5 was subjected to a heat treatment in the atmosphere at 650° C. for 1 hour.

Figure 3:
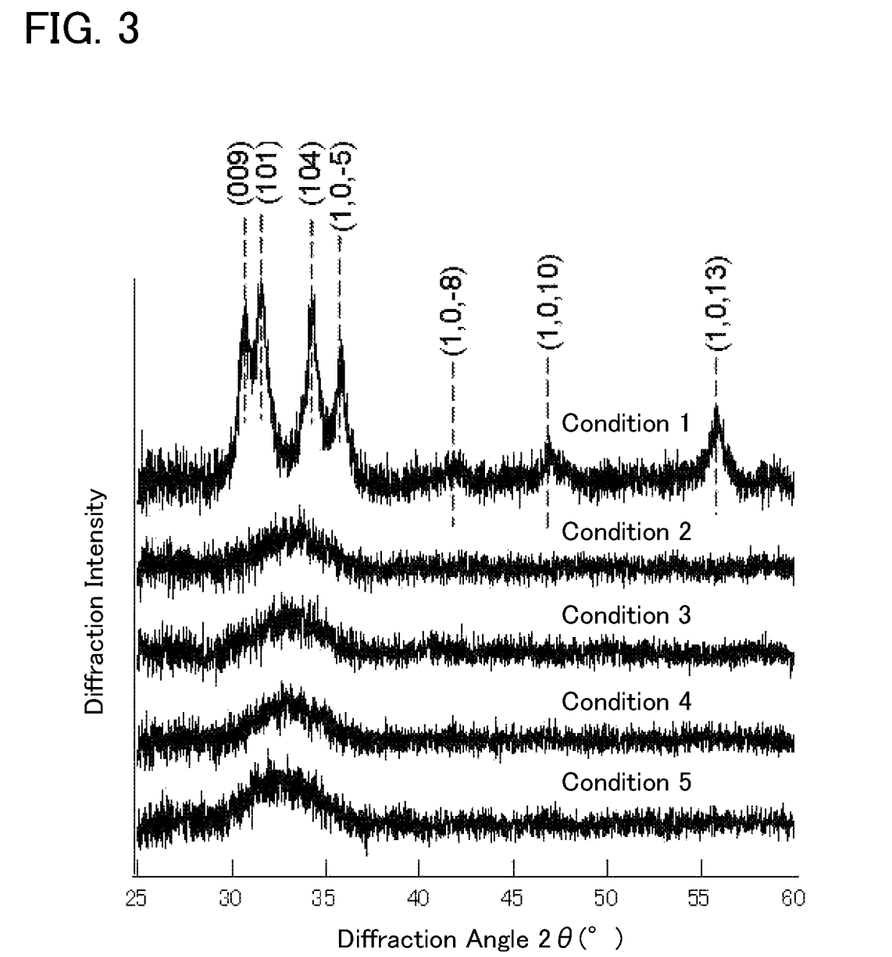
FIG. 3 illustrates a measurement result of X-ray diffraction of an oxide semiconductor film subjected to a heat treatment.

To evaluate crystallinity of each sample subjected to the heat treatment, X-ray diffraction (XRD) was measured by an out-of-plane method. FIG. 3 shows gas flow rate dependency of an XRD spectrum after the heat treatment. A horizontal axis represents an X-ray diffraction angle 2θ, and a vertical axis represents X-ray diffraction intensity. The XRD spectrum represents X-ray reflection intensity from a crystal lattice surface, and shows that the larger the peak intensity of the spectrum and the narrower the half bandwidth, the higher the crystallinity. Note that the crystal lattice surface and the X-ray diffraction angle correspond to each other, and if a crystal structure and the crystal lattice surface are different, a location where the XRD spectrum appears is different.

From FIG. 3, it was confirmed that in the XRD spectrum of the IGZO film that was formed under Condition 1 (argon:oxygen=45 sccm:0 sccm) in which oxygen flow rate is 0 sccm, sharp peaks near 2θ=28° to 32°, 42°, 47°, and 57° were observed; however, in the XRD spectra of the IGZO films that were formed under Conditions 2 to Condition 5, only broad peaks were observed. Note that numbers in parentheses in FIG. 3 represent lattice surfaces on which incident X-rays are reflected. With this, it was confirmed that although crystallization progresses under a condition in which oxygen atoms are lacking such as under Condition 1 in which oxygen flow rate is 0 sccm, with an IGZO film that is formed under a condition in which oxygen gas is supplied (Condition 2 to Condition 5), crystallization does not progress.

Furthermore, it was confirmed from a result of the above-mentioned X-ray diffraction that, in an IGZO film crystallized by performing a heat treatment, crystals grew while orienting with a c-axis with respect to a substrate surface.

According to the above, an IGZO film with high crystallinity can be formed by performing a heat treatment in the atmosphere on an IGZO film formed in a gas atmosphere in which oxygen gas is not supplied and only argon is supplied.

EXAMPLE 2

In this example, an oxide semiconductor film with high crystallinity formed by a manufacturing method of one embodiment of the present invention will be described. In this example, crystallinity of a laminated oxide semiconductor film will be described.

First, an In—Ga—Zn—O-based oxide semiconductor film with a thickness of 5 nm was formed over a quartz substrate as the first oxide semiconductor film (hereinafter referred to as the 1st-IGZO film), by a sputtering method without heating the substrate. A target composition of the 1st-IGZO was In$_2$O$_3$:Ga$_2$O$_3$:ZnO=1:1:1 [molar ratio], and application voltage and application pressure are 0.5 kw and 0.4 Pa, respectively. Furthermore, types of gas and flow rates thereof supplied during formation were argon: oxygen=30 sccm:15 sccm.

Next, the 1st-IGZO film was subjected to a heat treatment in the atmosphere at 700° C. for 1 hour to crystallize the 1st-IGZO film.

Next, an In—Ga—Zn—O-based oxide semiconductor with a thickness of 50 nm was formed as the second oxide semiconductor film (hereinafter referred to as the 2nd-IGZO film) over the crystallized 1st-IGZO film, by a sputtering method without heating the substrate. Also, types of gas and flow rates thereof supplied during formation of the 2nd-IGZO film were set according to Condition 6 to Condition 9. The target, application voltage, and the application pressure of the 2nd-IGZO were the same as the condition for the 1st-IGZO film. Hereinafter, the 1st-IGZO film and the 2nd-IGZO film will be collectively referred to as a "laminated IGZO film."
(Condition 6)
argon:oxygen=45 sccm:0 sccm
(Condition 7)
argon:oxygen=35 sccm:10 sccm
(Condition 8)
argon:oxygen=25 sccm:20 sccm
(Condition 9)
argon:oxygen=15 sccm:30 sccm Next, each of laminated IGZO films formed according to Condition 6 to Condition 9 was subjected to a heat treatment in the atmosphere at 1000° C. for 1 hour.

Figure 4:
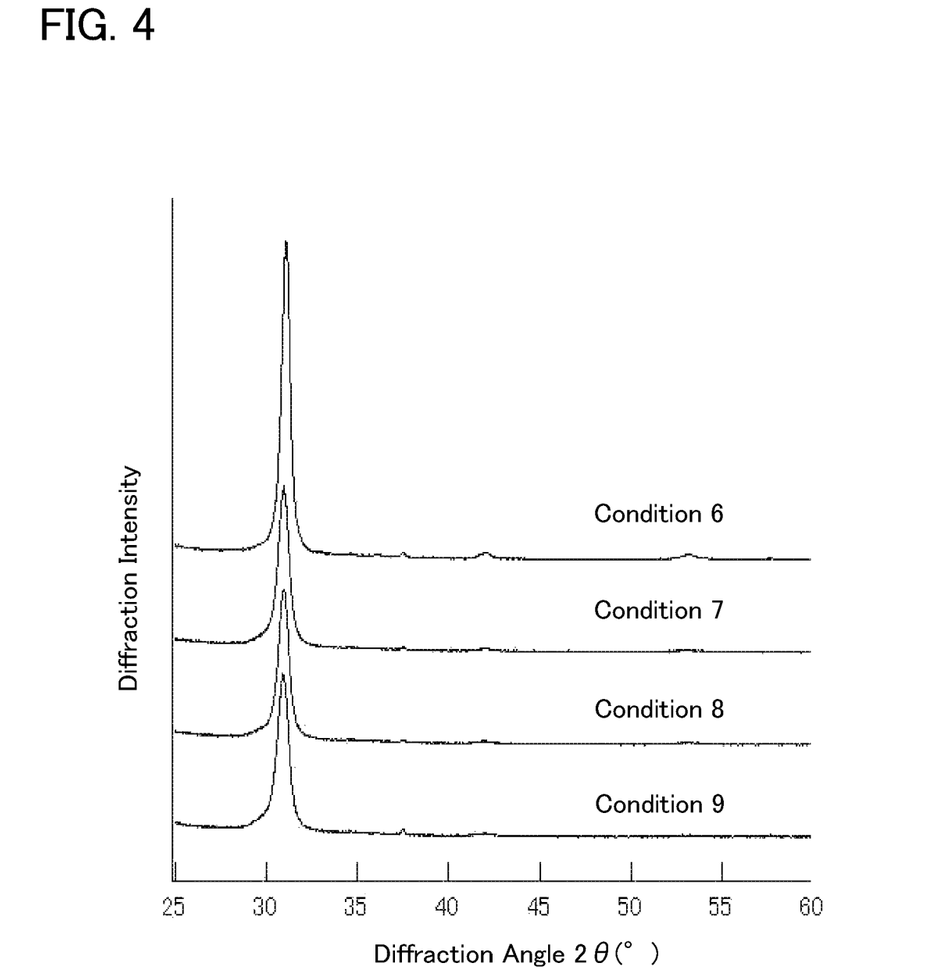
FIG. 4 illustrates a measurement result of X-ray diffraction after a laminated oxide semiconductor film is subjected to a heat treatment.

To evaluate crystallinity of each sample subjected to the heat treatment, X-ray diffraction (XRD) was measured by an out-of-plane method. FIG. 4 shows gas flow rate dependency of an XRD spectrum. A horizontal axis represents an X-ray diffraction angle 2θ, and a vertical axis represents X-ray diffraction intensity. The XRD spectrum represents X-ray reflection intensity from a crystal lattice surface, and shows that the larger the peak intensity of the spectrum and the narrower the half bandwidth, the higher the crystallinity. Note that the crystal lattice surface and the X-ray diffraction angle correspond to each other, and if a crystal structure and the crystal lattice surface are different, a location where the XRD spectrum appears is different.

From FIG. 4, since a peak corresponding to a (009) surface is observed around 2θ=33° in all of the laminated IGZO films formed according to Condition 6 to Condition 9 also, it was confirmed that these laminated IGZO films were crystallized. Furthermore, it was confirmed that the XRD spectrum of the laminated IGZO film formed under Condition 6 (argon:oxygen=45 sccm:0 sccm) in which oxygen flow rate is 0 sccm had a higher intensity than peaks of the XRD spectra of the laminated IGZO films formed under Condition 7 to Condition 9. This shows that crystallinity of the IGZO film formed under Condition 6 (argon:oxygen=45 sccm:0 sccm) in which oxygen flow rate is 0 sccm is higher than crystallinity of the laminated IGZO films formed under Condition 7 to Condition 9.

Furthermore, from a result of X-ray diffraction of the laminated IGZO films, it was confirmed that in the laminated IGZO films described in this example, crystals grew while orienting with a c-axis with respect to the substrates.

According to the above, regarding a laminated IGZO film also, a laminated IGZO film with high crystallinity can be formed by subjecting the laminated IGZO film formed without supplying oxygen gas, as in Condition 6, to a heat treatment in the atmosphere. Furthermore, crystallinity of the 1st-IGZO film formed in an atmosphere containing oxygen can also be improved by forming the 2nd-IGZO film in the atmosphere in which oxygen is purposely not contained, and then performing a heat treatment in an atmosphere containing oxygen.

This application is based on Japanese Patent Application serial no. 2010-048604 filed with Japan Patent Office on Mar. 5, 2010, the entire contents of which are hereby incorporated by reference.

EXPLANATION OF REFERENCE

101: substrate, 102: first oxide semiconductor film, 103: second oxide semiconductor film, 104: second oxide semiconductor film, 121: first oxide semiconductor film, 105: substrate, 106: protective insulating film, 107: gate insulating film, 110: transistor, 111: gate electrode, 115a: source electrode, 115b: drain electrode, 116: insulating film, 129: oxide semiconductor film, 130: oxide semiconductor film, 131: oxide semiconductor film.

The invention claimed is:

1. A manufacturing method of a semiconductor device, comprising the steps of:
forming a first oxide semiconductor film over a substrate;
crystallizing the first oxide semiconductor film by performing a first heat treatment;
forming a second oxide semiconductor film over the crystallized first oxide semiconductor film in an atmosphere which the second oxide semiconductor film formed therein is oxygen deficient; and
crystallizing the second oxide semiconductor film by performing a second heat treatment in an atmosphere containing oxygen.

2. The manufacturing method of a semiconductor device according to claim 1, wherein the first oxide semiconductor film is formed in an atmosphere in which oxygen is purposely not contained.

3. The manufacturing method of a semiconductor device according to claim 1, wherein the first oxide semiconductor film that is crystallized in the first heat treatment is used as a seed crystal by the second oxide semiconductor film that is to be crystallized in the second heat treatment.

4. The manufacturing method of a semiconductor device according to claim 1, wherein at least one of the first oxide semiconductor film and the second oxide semiconductor film is selected from an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, Al—Zn—O-based oxide semiconductor, an In—O-based oxide semiconductor, and an Sn—O-based oxide semiconductor, an Zn—O-based oxide semiconductor.

5. The manufacturing method of a semiconductor device according to claim 1, wherein the first oxide semiconductor film and the second oxide semiconductor film have a c-axis orientation with respect to a surface of the substrate.

6. The manufacturing method of a semiconductor device according to claim 1, wherein a carrier density of the first oxide semiconductor film and the second oxide semiconductor film is less than $1\times10^{14}/cm^3$.

7. The manufacturing method of a semiconductor device according to claim 1, wherein at least one of the first oxide semiconductor film and the second oxide semiconductor film is formed while the substrate is heated.

8. The manufacturing method of a semiconductor device according to claim 1, wherein the atmosphere which the second oxide semiconductor film formed therein is oxygen deficient is an atmosphere of nitrogen gas, helium gas, neon gas, argon gas, xenon gas, or krypton gas.

9. The manufacturing method of a semiconductor device according to claim 1, wherein the second oxide semiconductor film is formed by a sputtering method under a condition in which oxygen gas is not supplied.

10. A manufacturing method of a transistor, comprising the steps of:
forming a gate electrode over a substrate;
forming a gate insulating film over the gate electrode;
forming a first oxide semiconductor film over the gate insulating film;
crystallizing the first oxide semiconductor film by performing a first heat treatment;
forming a second oxide semiconductor film over the crystallized first oxide semiconductor film in an atmosphere which the second oxide semiconductor film formed therein is oxygen deficient;
crystallizing the second oxide semiconductor film by performing a second heat treatment in an atmosphere containing oxygen;
forming a source electrode and a drain electrode over the crystallized second oxide semiconductor film;
forming an insulating film containing an oxygen atom over the crystallized second oxide semiconductor film, the source electrode and the drain electrode; and
oxidizing the crystallized first oxide semiconductor film and the crystallized second oxide semiconductor film by performing a third heat treatment.

11. The manufacturing method of a transistor according to claim 10, wherein the first oxide semiconductor film is formed in an atmosphere in which oxygen is purposely not contained.

12. The manufacturing method of a transistor according to claim 10, wherein the first oxide semiconductor film that is crystallized by the first heat treatment is used as a seed crystal by the second oxide semiconductor film that is to be crystallized by the second heat treatment.

13. The manufacturing method of a transistor according to claim 10, wherein at least one of the first oxide semiconductor film and the second oxide semiconductor film is selected from an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, Al—Zn—O-based oxide semiconductor, an In—O-based oxide semiconductor, and an Sn—O-based oxide semiconductor, an Zn—O-based oxide semiconductor.

14. The manufacturing method of a transistor according to claim 10, wherein the first oxide semiconductor film and the second oxide semiconductor film have a c-axis orientation with respect to a surface of the substrate.

15. The manufacturing method of a transistor according to claim 10, wherein a carrier density of the first oxide semiconductor film and the second oxide semiconductor film is less than $1\times10^{14}/cm^3$.

16. The manufacturing method of a transistor according to claim 10, wherein at least one of the first oxide semiconductor film and the second oxide semiconductor film is formed while the substrate is heated.

17. The manufacturing method of a transistor according to claim 10, wherein the atmosphere which the second oxide semiconductor film formed therein is oxygen deficient is an atmosphere of nitrogen gas, helium gas, neon gas, argon gas, xenon gas, or krypton gas.

18. The manufacturing method of a transistor according to claim 10, wherein the second oxide semiconductor film is formed by a sputtering method under a condition in which oxygen gas is not supplied.

19. A manufacturing method of a semiconductor device, comprising the steps of:
forming a first oxide semiconductor film over a substrate;
performing a first heat treatment to the first oxide semiconductor film in an atmosphere containing oxygen at a temperature of 600 ° C. or more so as to supply oxygen to the first oxide semiconductor film;
forming a second oxide semiconductor film over the first oxide semiconductor film by a sputtering method using an oxide semiconductor target under an inert gas in which oxygen gas is not supplied so that the second oxide semiconductor film has an oxygen deficiency; and
performing a second heat treatment to the second oxide semiconductor film in an atmosphere containing oxygen at a temperature of 600 ° C. or more so as to supply oxygen to the second oxide semiconductor film,
wherein, after the second heating, the second oxide semiconductor film has a c-axis orientation with respect to a surface of the substrate.

20. The manufacturing method of a semiconductor device according to claim 19, wherein the second oxide semiconductor film is selected from an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, Al—Zn—O-based oxide semiconductor, an In—O-based oxide semiconductor, an Sn—O-based oxide semiconductor, and an Zn—O-based oxide semiconductor.

21. The manufacturing method of a semiconductor device according to claim 19, wherein a carrier density of the second oxide semiconductor film is less than $1\times10^{14}/cm^3$.

22. The manufacturing method of a semiconductor device according to claim 19, wherein the second oxide semiconductor film is formed while the substrate is heated.

23. The manufacturing method of a semiconductor device according to claim 19, wherein the inert gas is any of nitrogen gas, helium gas, neon gas, argon gas, xenon gas, and krypton gas.

* * * * *

UNITED STATES PATENT AND TRADEMARK OFFICE
CERTIFICATE OF CORRECTION

PATENT NO. : 8,703,531 B2  
APPLICATION NO. : 13/034725  
DATED : April 22, 2014  
INVENTOR(S) : Honda et al.

Page 1 of 1

It is certified that error appears in the above-identified patent and that said Letters Patent is hereby corrected as shown below:

In the Claims

In claim 4, at column 18, line 55, "Al-Zn-O-based" should be --an Al-Zn-O-based--;

In claim 4, at column 18, line 56, "and an Sn-O-based" should be --an Sn-O-based--;

In claim 4, at column 18, line 57, "an Zn-O-based" should be --and an Zn-O-based--;

In claim 13, at column 19, line 54, "Al-Zn-O-based" should be --an Al-Zn-O-based--;

In claim 13, at column 19, line 56, "and an Sn-O-based" should be --an Sn-O-based--;

In claim 13, at column 19, line 56, "an Zn-O-based" should be --and an Zn-O-based--;

In claim 20, at column 20, line 47, "Al-Zn-O-based" should be --an Al-Zn-O-based--.

Signed and Sealed this  
Twenty-third Day of September, 2014

Michelle K. Lee  
*Deputy Director of the United States Patent and Trademark Office*